United States Patent
Chu et al.

(10) Patent No.: US 9,337,168 B2
(45) Date of Patent: May 10, 2016

(54) HERMETIC WAFER LEVEL PACKAGING

(71) Applicant: TAIWAN SEMICONDUCTOR MANUFACTURING COMPANY, LTD., Hsin-Chu (TW)

(72) Inventors: Richard Chu, Taipei (TW); Martin Liu, Yonghe (TW); Chia-Hua Chu, Zhubei (TW); Yuan-Chih Hsieh, Hsinchu (TW); Chung-Hsien Lin, Hsinchu (TW); Lan-Lin Chao, Sindian (TW); Chun-Wen Cheng, Zhubei (TW); Mingo Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/174,214

(22) Filed: Feb. 6, 2014

(65) Prior Publication Data
US 2014/0154841 A1 Jun. 5, 2014

Related U.S. Application Data

(62) Division of application No. 12/846,504, filed on Jul. 29, 2010, now Pat. No. 8,648,468.

(51) Int. Cl.
| H01L 21/44 | (2006.01) |
| H01L 23/00 | (2006.01) |
| B81C 1/00 | (2006.01) |
| H01L 25/00 | (2006.01) |
| H01L 23/48 | (2006.01) |

(52) U.S. Cl.
CPC ............ *H01L 24/94* (2013.01); *B81C 1/00269* (2013.01); *H01L 25/50* (2013.01); *B81B 2207/015* (2013.01); *B81C 2203/0109* (2013.01); *B81C 2203/0771* (2013.01); *H01L 23/481* (2013.01); *H01L 2225/06513* (2013.01); *H01L 2225/06541* (2013.01); *H01L 2924/0002* (2013.01); *H01L 2924/1306* (2013.01); *H01L 2924/1461* (2013.01)

(58) Field of Classification Search
CPC .......... H01L 2924/01078; H01L 2924/01079; H01L 2924/01029; H01L 2924/01013; H01L 2924/1461; H01L 2924/1306; H01L 2924/0002; H01L 2924/06513; H01L 2924/06541; H01L 24/94; H01L 25/50
USPC .................................. 438/106–110, 112, 118
See application file for complete search history.

(56) References Cited

U.S. PATENT DOCUMENTS

| 7,442,570 B2 | 10/2008 | Nasiri et al. |
| 8,035,176 B2 | 10/2011 | Jung et al. |
| 2011/0168434 A1 | 7/2011 | Farooq et al. |
| 2012/0018868 A1* | 1/2012 | Oganesian et al. ........... 257/686 |

* cited by examiner

*Primary Examiner* — Hoa B Trinh
(74) *Attorney, Agent, or Firm* — Haynes and Boone, LLP

(57) ABSTRACT

Provided is a wafer level packaging. The packaging includes a first semiconductor wafer having a transistor device and a first bonding layer that includes a first material. The packaging includes a second semiconductor wafer having a second bonding layer that includes a second material different from the first material, one of the first and second materials being aluminum-based, and the other thereof being titanium-based. Wherein a portion of the second wafer is diffusively bonded to the first wafer through the first and second bonding layers.

20 Claims, 7 Drawing Sheets

HERMETIC WAFER LEVEL PACKAGING

PRIORITY DATA

The present application is a divisional patent application of U.S. patent application Ser. No. 12/846,504, filed on Jul. 29, 2010, entitled "Hermetic Wafer Level Packaging", the disclosure of which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

As semiconductor device sizes continue to shrink, new packaging technologies have been developed to accommodate (and to take advantage of) the small semiconductor device sizes. One type of packaging technology is wafer level packaging, where the IC devices are packaged at the wafer level, before the wafer is sliced. However, existing wafer level packaging techniques may be expensive and may not be fully compatible with current Complementary Metal-Oxide-Semiconductor (CMOS) fabrication processes.

Therefore, while existing wafer level packaging methods have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
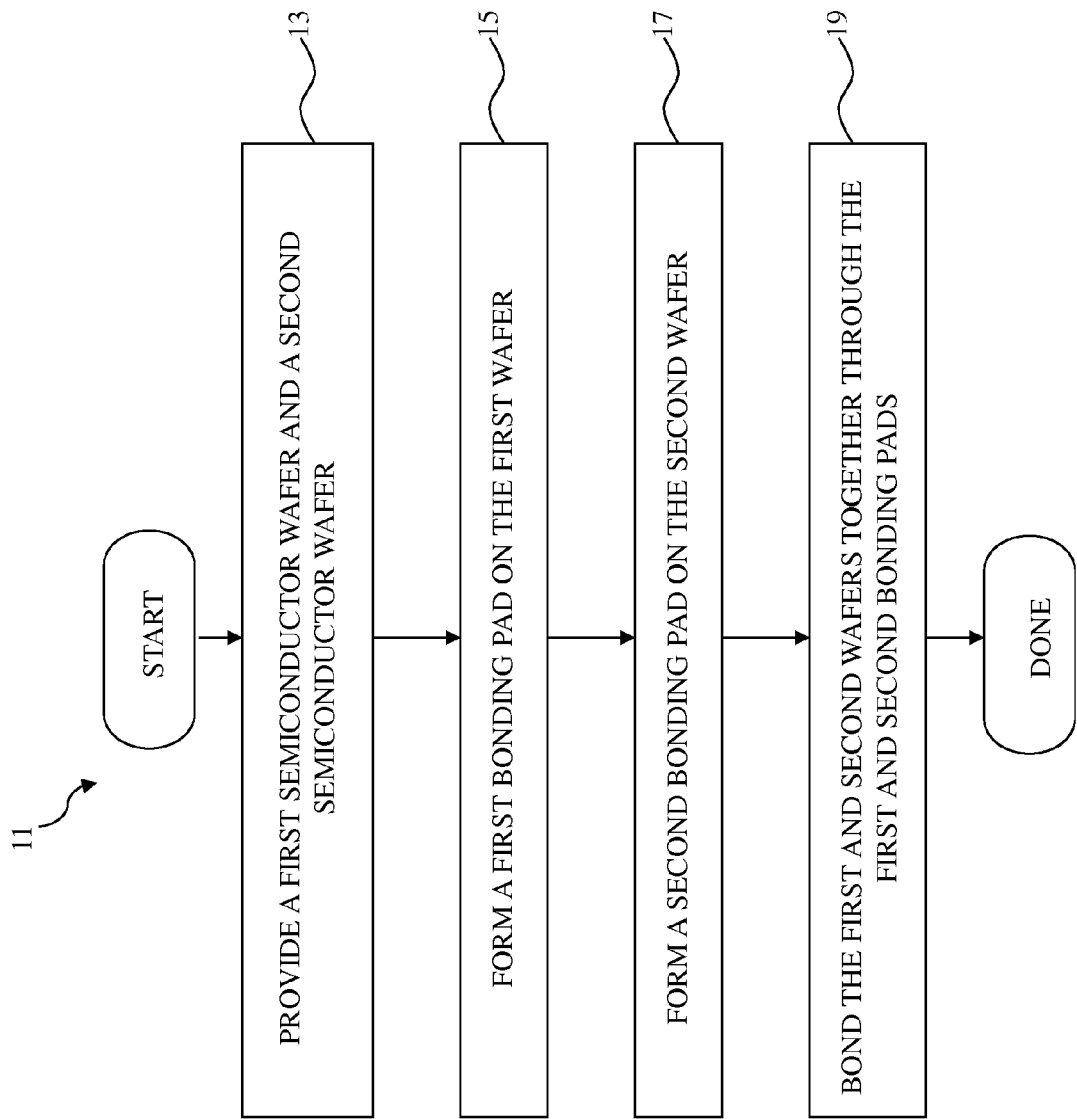
FIG. 1 is a flowchart illustrating a method for performing a wafer level packaging according to various aspects of the present disclosure.

Illustrated in FIG. 1 is a flowchart of a method 11 for performing a wafer level packaging according to various aspects of the present disclosure. The method 11 begins with block 13 in which a first semiconductor wafer and a second semiconductor wafer are provided. The method 11 continues with block 15 in which a first bonding pad is formed on the first wafer. The first wafer includes a first bonding pad. The method 11 continues with block 17 in which a second bonding pad is formed on the second wafer. The second bonding pad includes a second material that is different from the first material. One of the first and second materials is aluminum, and the other one of the first and second materials is a titanium alloy. The method 11 continues with block 19 in which the first and second wafers are bonded together through the first and second bonding pads.

Figure 2:
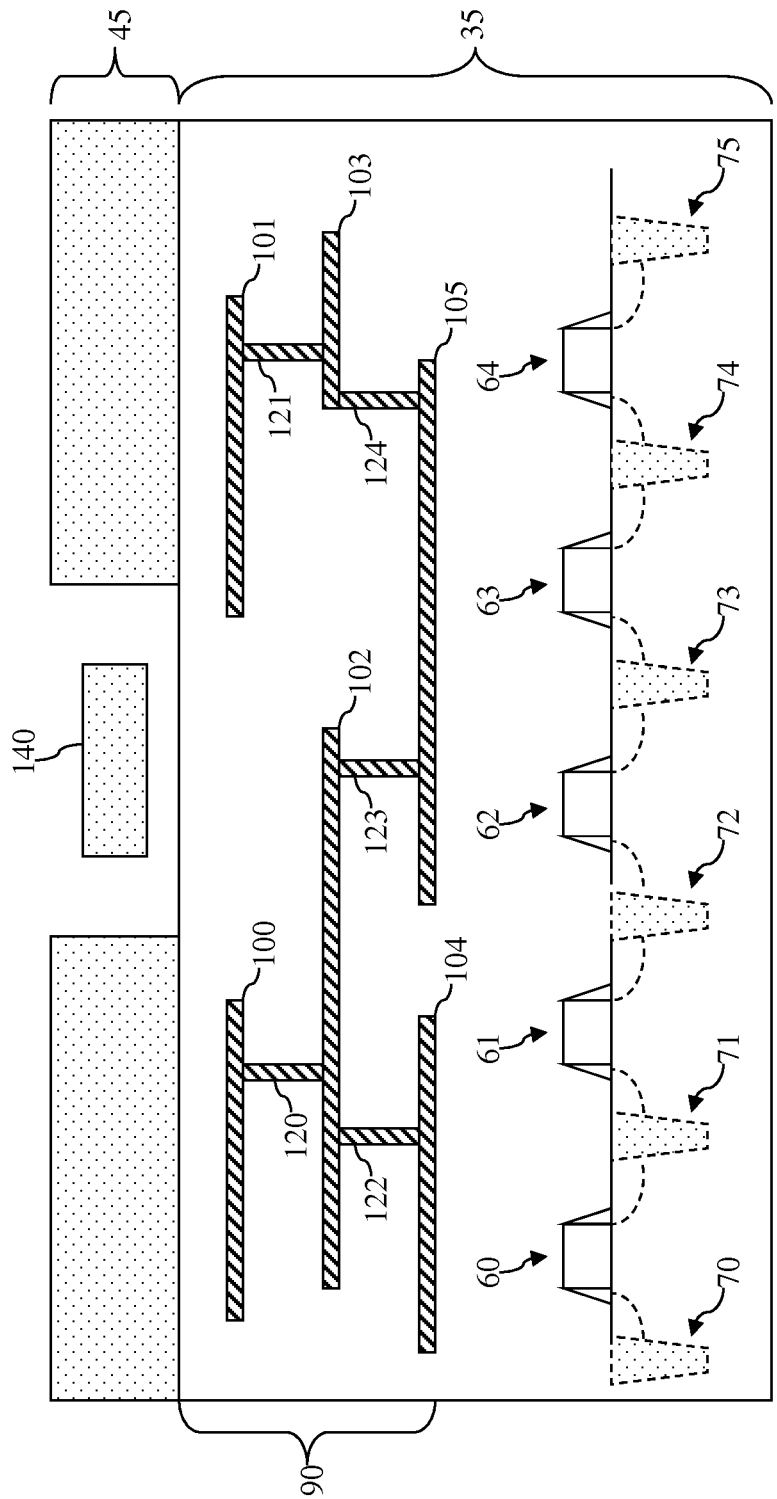
FIGS. 2-4 are diagrammatic fragmentary cross-sectional side views of various wafers at different stages of packaging in accordance with an embodiment of the method illustrated in FIG. 1.
Figure 3:
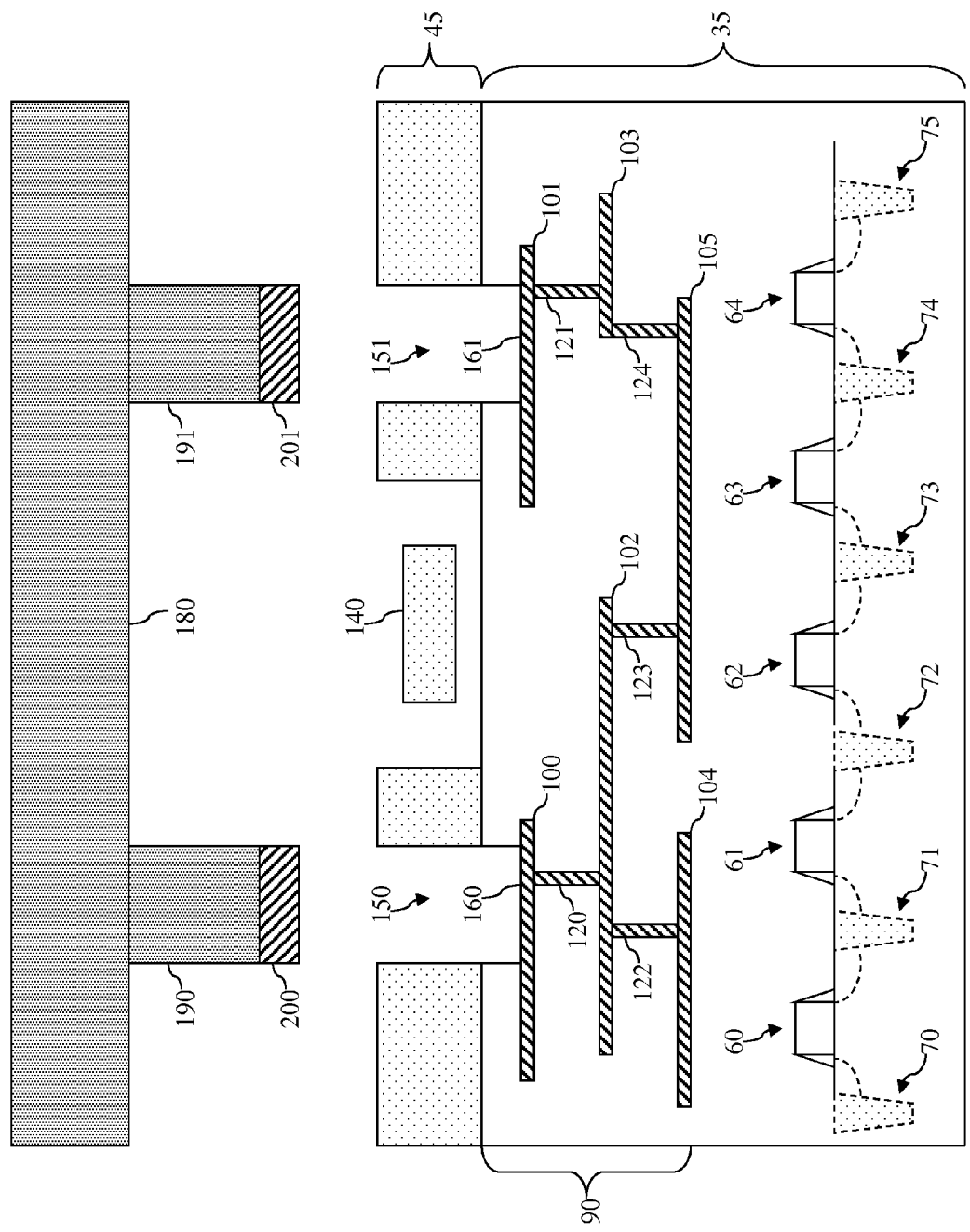
Figure 4:
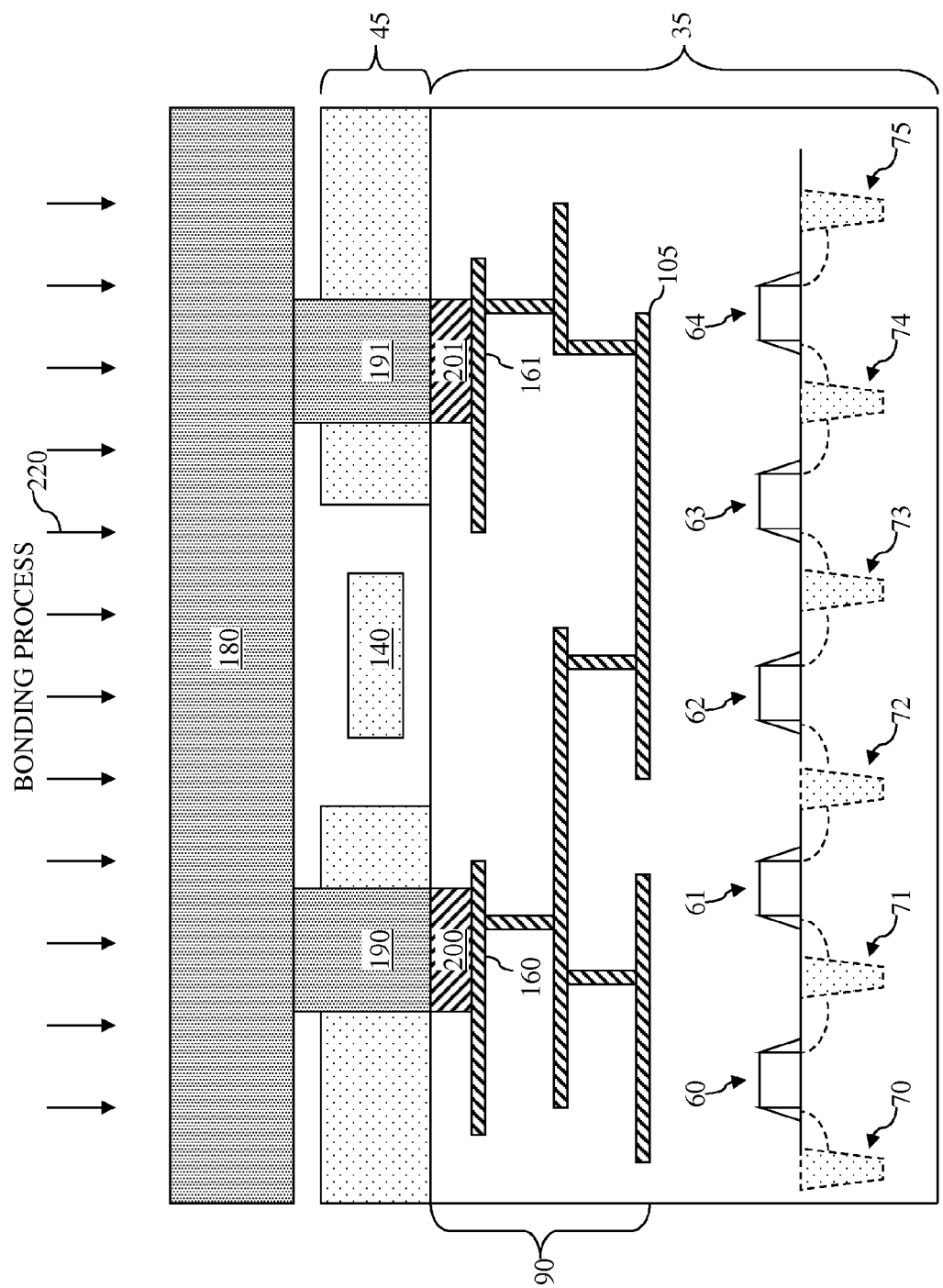

FIGS. 2 to 4 are diagrammatic fragmentary cross-sectional side views of portions of various wafers undergoing wafer level packaging at different stages according to one embodiment. It is understood that FIGS. 2 to 4 have been simplified for a better understanding of the inventive concepts of the present disclosure.

FIG. 2 illustrates a portion of a wafer 35 and a portion of a wafer 45. The wafer 35 and 45 may also be referred to as substrates. The wafer 35 includes silicon doped with either a P-type dopant such as boron or N-type dopant such as phosphorous or arsenic. The wafer 35 may include other elementary semiconductors such as germanium and diamond. The wafer 35 may optionally include a compound semiconductor and/or an alloy semiconductor. Further, the wafer 35 may include an epitaxial layer (epi layer), may be strained for performance enhancement, and may include a silicon-on-insulator (SOI) structure.

The wafer 35 includes a plurality of transistor devices, for example Complementary Metal-Oxide-Semiconductor (CMOS) Field-Effect Transistor (FET) devices. To provide an example, simplified cross-sectional views of transistor devices 60-64 are shown in FIG. 2. These transistor devices 60-64 may each include a gate, a doped source region, and a doped drain region. The gate may be a polysilicon gate or a metal gate, and may include a gate dielectric layer, a gate electrode layer, and gate spacers. The transistor devices 60-74 may also be isolated from one another by isolation structures 70-75. The isolation structures 70-74 may each include a shallow trench isolation (STI) feature or a deep trench isolation (DTI) feature. The isolation structures 70-75 may also each include a doped well formed around the STI feature or the DTI feature. Although not illustrated, it is understood that many other different types of transistor devices may be formed in the wafer 35. For purposes of simplicity, these devices are not illustrated herein.

The wafer 35 also includes an interconnect structure 90. The interconnect structure 90 includes an interlayer dielectric (ILD) and a multilayer interconnect (MLI) structure formed in a configuration such that the ILD separates and isolates each of the metal layers in the MLI structure. The MLI structure includes contacts/vias and metal lines (metal interconnect features) that provide interconnections (e.g., wiring) between the various doped features, circuitry, and input/output of transistor devices (e.g., transistor devices 60-64) in the wafer 35. For the sake of providing an example, simplified cross-sectional views of metal lines 100-105 and vias/contacts 120-124 are illustrated in FIG. 2. Metal lines 100-101 are formed above all the other metal lines and therefore may be referred to as top metal or a top metal layer.

In one embodiment, the metal lines 100-105 may include aluminum-based material. In another embodiment, the metal lines 100-105 may include a titanium-based material. The metal lines 100-105 may be formed by a technique including chemical vapor deposition (CVD), physical vapor deposition (PVD), sputtering, plating, combinations thereof, or other suitable processes.

The wafer 45 includes a semiconductor material such as silicon. The wafer 45 also includes one or more Micro-Electrical-Mechanical System (MEMS) devices. MEMS devices include very small electrical/mechanical devices, such as sensors, actuators, mirrors, gyroscopes, accelerometers, or other small machines. As an example, these tiny MEMS devices may be formed by patterning appropriate portions of the wafer 45. A MEMS device may also have one or more processors or controllers that communicate with and/or control the mechanical components.

MEMS devices may also be referred to as micromachines, and the MEMS technology may also be referred to as Micro Systems Technology (MST). The MEMS devices may have device sizes ranging from about 10 microns to 1000 microns, and may have device components that have sizes ranging from about 1 to 100 microns. A simplified diagrammatic view of a MEMS device 140 (which may also be referred to as proof mass) is illustrated in FIG. 2 for the sake of illustration and to facilitate ensuing discussions.

The wafers 35 and 45 are bonded together using a suitable bonding process known in the art. For example, an optical bonding or a fusion bonding process known in the art may be utilized to bond the wafers 35 and 45 together.

Referring now to FIG. 3, openings 150-151 are formed in the wafers 35 and 45 to expose a portion of the metal lines 100 and 101. The openings 150-151 actually are different parts of a single "ring" opening, but appear as two openings in this cross-sectional side view. The "ring" opening may have a circular shape, a rectangular shape, an oval shape, or another suitable shape. For the sake of illustration, the openings 150-151 are still referred separately therebelow, even though it is understood that they are actually parts of the same opening.

The openings 150-151 may be formed by an etching process known in the art, such as a dry etching process. The openings 150-151 here will be used for a bonding process (discussed in FIG. 4 later), thus the openings 150-151 may also be collectively referred to as a bond ring. The exposed portions of the metal lines 100 and 101 will be used as bonding pads for the bonding process, thus they may be referred to as bonding pads (or bonding layers) 160-161 as well.

A wafer 180 is provided. The wafer 180 may include a semiconductor material such as silicon. The wafer 180 will be bonded to the wafer 35 in the bonding process discussed later, in a manner that the wafer 180 will "cap off" the MEMS device 140, thus the wafer 180 may also be referred to as a capping layer. The wafer 180 includes protruding portions 190 and 191, which will be inserted into the openings 150 and 151 when the wafers 35 and 180 are bonded together later.

Bonding pads 200 and 201 are formed on the protruding portions 190 and 191, respectively. The bonding pads 200-201 may be formed by PVD, CVD, evaporation, electron beam gun (E-Gun), ion beam, energy beam, plating, or combinations thereof. In an embodiment, the bonding pads 200-201 each include a titanium-based material or titanium alloy. For example, the titanium-based material or alloy of the bonding pads 200-201 may have the following chemical composition: $Ti_xAl_yCu_z$, wherein x, y, and z are each in a range from 0 to 100. In other embodiments, the bonding pads 200-201 may include TiAl, TiGe, AlGe, SiGe, or other suitable materials. It is also understood that similar to the openings 150-151 discussed above, the bonding pads 200-201 may actually be portions of the same bonding pad "ring".

Referring now to FIG. 4, a bonding process 220 is performed to bond the wafer 180 to the wafer 35. The bonding process 220 may include:

a process temperature that is greater than approximately 100 degrees Celsius;

a process pressure that is greater than approximately 10 kilo-newtons; and a process duration that is in a range from approximately 3 minutes to approximately 300 minutes.

As a result of the bonding process 220, the wafer 180 is firmed bonded to the wafer 35 through the bonding pads 200 and 160, and through the bonding pads 201 and 161, which serve as bonding interfaces. The bonding pads 200 and 160 are bonded together through metal diffusion, as are the bonding pads 201 and 161. Bonding by way of metal diffusion is such that the metal ions from one bonding pad 200/201 respectively diffuse into the other bonding pad 160/161, and vice versa. Metal diffusion does not involve melting the materials of the bonding pads 160-161 and 200-201. Metal diffusion also results in high bonding strength, and therefore the bonding area can be relatively small. In an embodiment, a total area of all the bonding pads (including the bonding pads 200 and 201) is smaller than about 5% of a total area of the wafer 35.

The wafers 35 and 180 are bonded in a manner to hermetically seal off the MEMS device 140 from external materials. Meanwhile, other MEMS devices (not illustrated) similar to the MEMS device 40 are hermetically sealed in the same fashion. In this manner, the wafer 45 is packaged on a wafer level. It is understood that in other embodiments, the bonding pads 200-201 may include an aluminum-based material, and the bonding pads 160-161 may include a titanium-based material or a titanium alloy.

After the wafers 35 and 180 are bonded, a post-bonding annealing process may be performed to increase bonding strength. The post-bonding annealing process may use a process temperature in a range from approximately 200 degrees Celsius to approximately 500 degrees Celsius for a process duration in a range from approximately 0.5 hours to approximately 6 hours.

The embodiment discussed above in FIGS. 2-4 offers several advantages compared to existing wafer level packaging techniques. It is understood, however, that different embodiments may offer different advantages, and that no particular advantage is required for all embodiments. One advantage is that the titanium alloy material allows for a lower bonding temperature and shorter bonding process duration compared to existing methods. Thus, the embodiment discussed above offers an improved thermal budget and is less likely to cause damages to the devices on the bonded wafers.

Another advantage is that the titanium alloy material has lower resistivity compared to existing bonding materials, which may be based on a semiconductor material and thus has higher resistivity. The lower resistivity of the embodiment disclosed herein allows an electrically conductive path to be established between two wafers. The conductive path can be localized by patterning the desired portions of the wafers to form the openings inside which bonding takes place.

Further, the titanium materials used herein are already present in current CMOS processes. As such, the implementation of the embodiment discussed above requires no additional investments in process tools or materials, as it is fully compatible with current CMOS processes. In addition, the titanium materials used herein may be cheaper than existing bonding materials, which may require gold.

Another advantage is that the metal diffusion allows for high bonding strength. Thus, the bonding area can be reduced compared to existing methods. Furthermore, since metal diffusion does not involve melting materials, no melted fluids or liquids will leak out of bonding interfaces. In other words, the bonding may be carried out in a manner that it is "squish-free". The embodiment disclosed herein also allows good hermeticity compared to some traditional bonding techniques.

Figure 5:
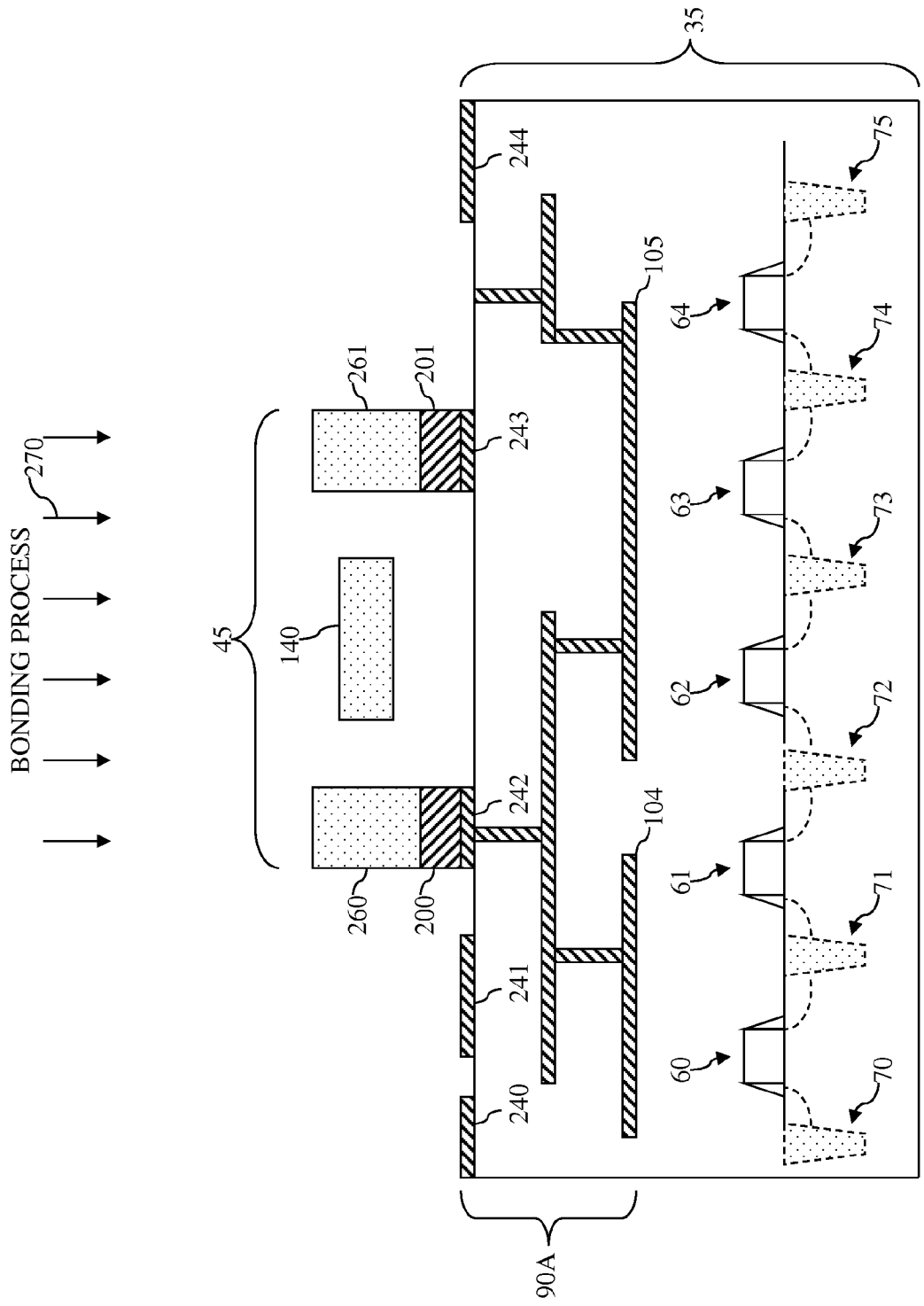
FIGS. 5-6 are diagrammatic fragmentary cross-sectional side views of various wafers at different stages of packaging in accordance with an alternative embodiment of the method illustrated in FIG. 1.
Figure 6:
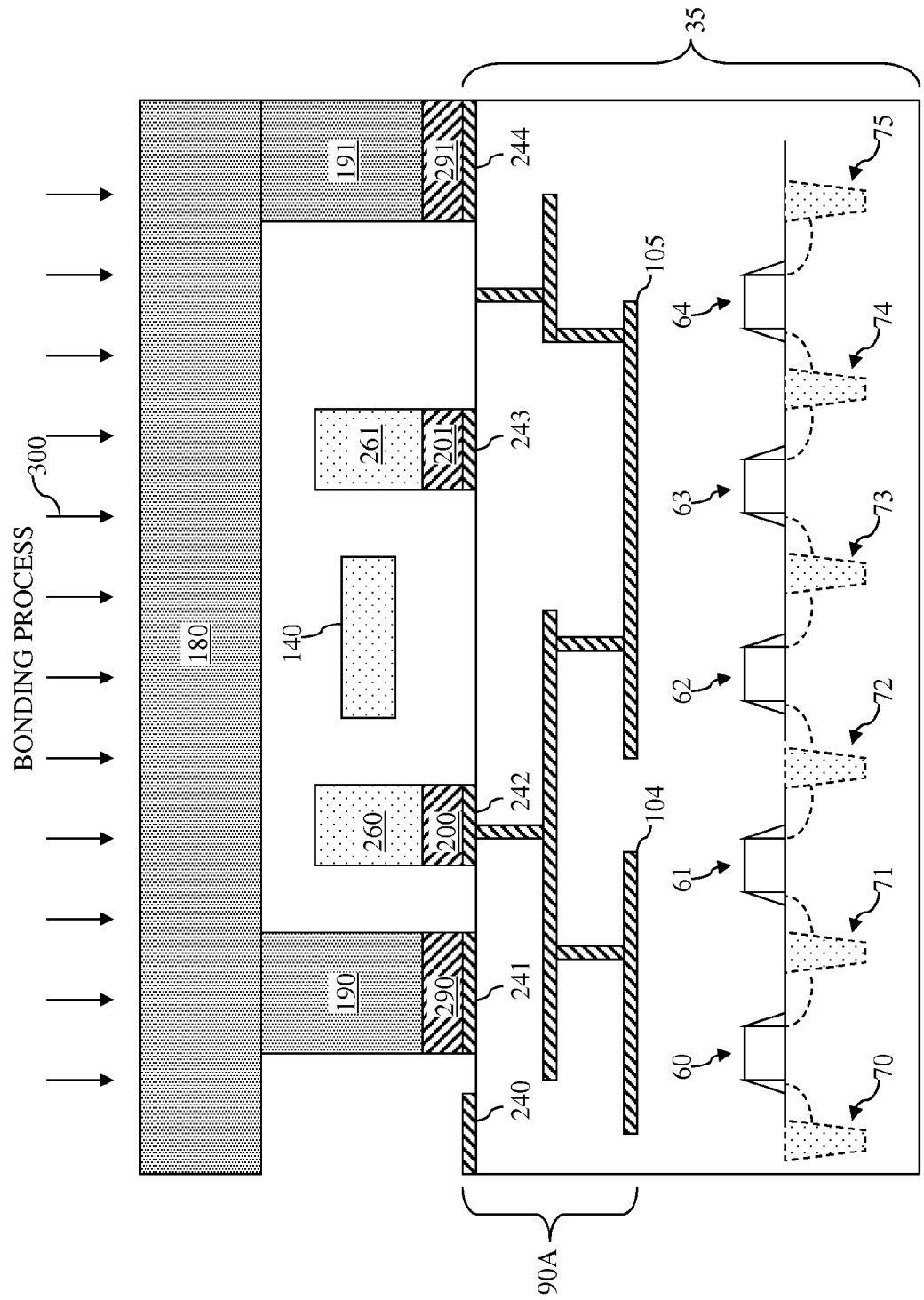

FIGS. 5 to 6 are simplified diagrammatic fragmentary cross-sectional side views of portions of various wafers undergoing wafer level packaging at different stages according to another embodiment. Also, the embodiment illustrated in FIGS. 5-6 contains similar features and similar processes as the embodiment discussed above and illustrated in FIGS. 2-4. Thus, similar features are labeled the same in both embodiments for the sake of consistency and clarity.

Referring to FIG. 5, the wafer 35 containing transistor devices 60-64 also contains a slightly different interconnect structure 90A. The interconnect structure 90A includes top layer metal lines (interconnect features) 240-244. The metal lines 240-244 may each serve as a bonding pad and may include materials similar to the bonding pads 160-161 (shown in FIG. 4) discussed above. The wafer 45 includes the MEMS device 140 and portions 260-261 that are adjacent to the MEMS device 140. The portions 260-261 have the bonding pads 200 and 201 formed thereon, respectively. The wafers 35 and 45 are bonded together in a bonding process 270 similar to the bonding process 220 (shown in FIG. 4) described above. In particular, the bonding pad 200 is diffusively bonded with the bonding pad 242, and the bonding pad 201 is diffusively bonded with the bonding pad 243.

Referring now to FIG. 6, the wafer 180 (or capping layer) has bonding pads 290-291 formed thereon. The bonding pads 290-291 are similar to the bonding pads 200-201. The wafer 180 is bonded to the wafer 35 using a bonding process 300 that is similar to the bonding process 220 (illustrated in FIG. 4) discussed above. In particular, the bonding pads 290 and 291 are respectively bonded to the bonding pads 241 and 244. At this time, the MEMS device 140 is hermetically sealed.

The embodiment illustrated in FIGS. 5-6 uses similar titanium-based materials for its bonding pads and thus offers the same advantages as the embodiment illustrated in FIGS. 2-4 discussed above. Another advantage offered by the embodiment of FIGS. 5-6 is that since the bonding processes do not melt anything, a subsequent bonding processes may be performed without re-melting and thus possibly shifting the previously bonded components. Stated differently, the bonded components remain in solid form throughout the previous and subsequent bonding processes, and thus no undesired shifting would ever occur. In comparison, under existing bonding methods, previously bonded components may move around because they may be melted again by the subsequent bonding process, which may lead to defects.

Figure 7:
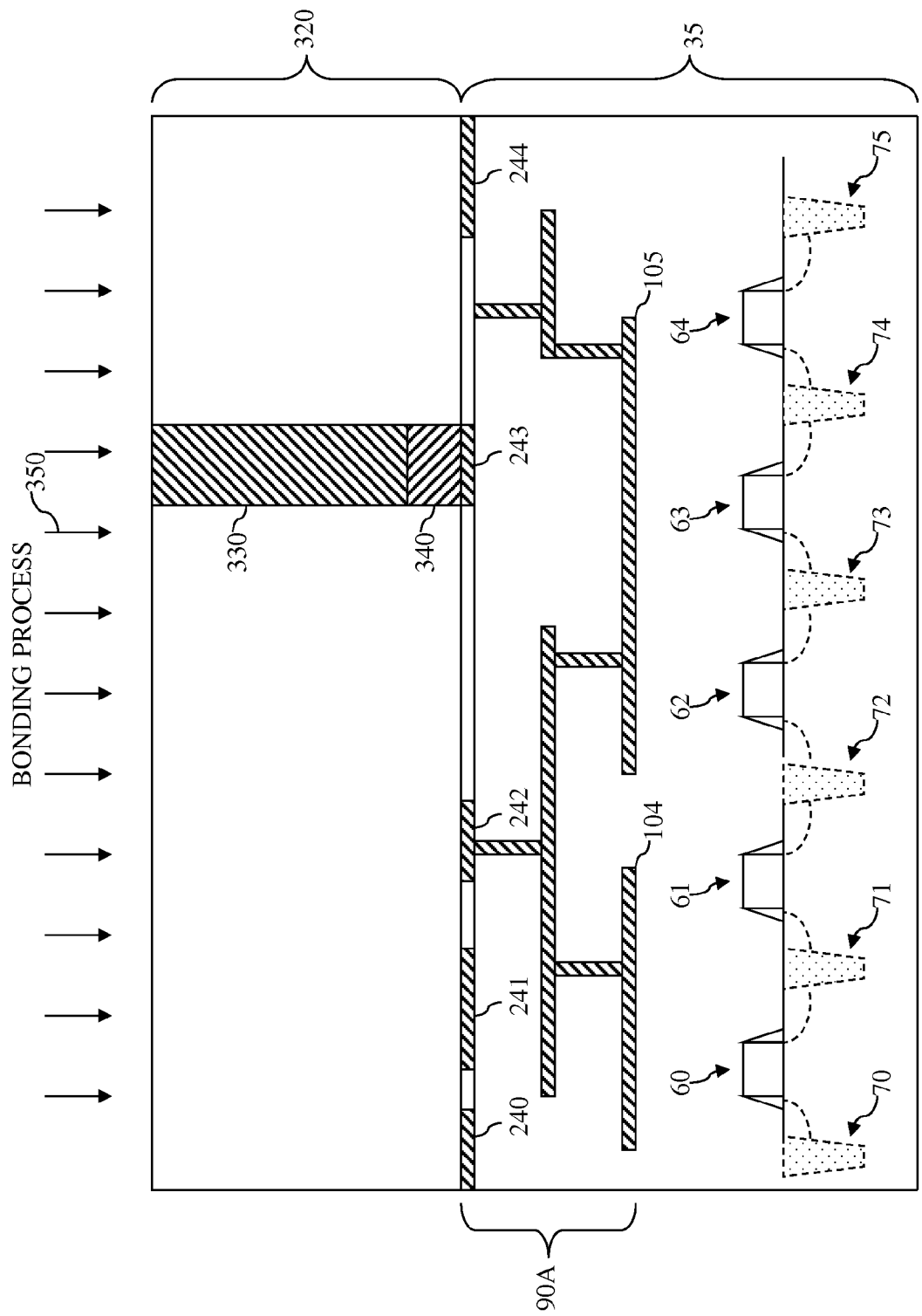
FIG. 7 is a diagrammatic fragmentary cross-sectional side view of various wafers at a stage of packaging in accordance with another alternative embodiment of the method illustrated in FIG. 1.

FIG. 7 is a simplified diagrammatic fragmentary cross-sectional side view of portions of various wafers undergoing wafer level packaging at one stage according to another alternative embodiment. Once again, features similar to those that appear in the embodiments illustrated in FIGS. 2-4 and 5-6 are labeled the same in FIG. 7 for the sake of consistency and clarity.

Referring to FIG. 7, a wafer 320 is bonded to the wafer 35. The wafer 320 is a three-dimensional integrated circuit (3D-IC) wafer. The wafer 320 may include a plurality of transistor devices, such as transistor devices similar to the transistor devices 60-64. The wafer 320 may also include an interconnect structure that includes various metal layers and vias/contacts. For the sake of simplicity, these transistor devices and the detailed structure of the interconnect structure are not illustrated herein.

The wafer 320 has a through-silicon-via (TSV) 330 that is coupled to its interconnect structure (or is considered to be a part of the interconnect structure). The TSV 330 extends through the wafer 320. A bonding pad 340 is formed on the TSV 330. The bonding pad 340 is similar to the bonding pads 200-201 (shown in FIGS. 4-6) discussed above. The wafer 320 is bonded to the wafer 35 using a bonding process 350 that is similar to the bonding process 270 (shown in FIG. 4) discussed above. In other words, the wafers 320 and 35 are diffusively bonded through the bonding pads 340 and 243. Hence, the embodiment shown in FIG. 7 has at least the same advantages as the embodiment discussed above in association with FIGS. 2-4.

In addition, although not illustrated, other 3D-IC wafers may be stacked on top of (and bonded to) the wafer 320 in a similar fashion. The bonding of these additional 3D-IC wafers may involve performing multiple bonding processes. In that case, the embodiment of FIG. 7 may have the same advantages as those discussed above in association with the embodiment of FIGS. 5-6. Namely, subsequent bonding processes will not melt previously bonded components, and thus no undesired shifting will occur.

It is understood that the methods discussed herein may be applied to other packaging scenarios. For example, they may be used to carry out chip-scale-packaging (CSP). Furthermore, it is understood that additional processes may be performed to complete the packaging of the wafers. For example, one or more wafers may undergo passivation processes and wafer slicing/dicing processes after the wafer bonding.

Thus, one of the broader forms of the present disclosure involves an apparatus that includes a first substrate having a first bonding pad, the first bonding pad including a first material. The apparatus also includes a second substrate having a second bonding pad, the second bonding pad including a second material different from the first material, one of the first and second materials being aluminum, and the other thereof being a titanium alloy. Wherein a portion of the second substrate is bonded to the first substrate through the first and second bonding pads.

Another of the broader forms of the present disclosure involves a wafer level packaging. The packaging includes a first semiconductor wafer having a transistor device and a first bonding layer that includes a first material. The packaging includes a second semiconductor wafer having a second bonding layer that includes a second material different from the first material, one of the first and second materials being aluminum-based, and the other thereof being titanium-based. Wherein a portion of the second wafer is diffusively bonded to the first wafer through the first and second bonding layers.

Still another of the broader forms of the present disclosure involves a method of packaging. The method includes providing a first semiconductor wafer and a second semiconductor wafer. The method also includes forming a first bonding pad on the first wafer, the first bonding pad including a first bonding material. The method also includes forming a second bonding pad on the second wafer, the second bonding pad including a second material different from the first material, one of the first and second materials being aluminum, and the other thereof being a titanium alloy. The method also includes bonding the first and second wafers together through the first and second bonding pads.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of packaging, comprising:
   providing a first wafer, wherein the first wafer contains a plurality of transistors and an interconnect structure having a plurality of metal layers that each contain a plurality of metal lines;
   providing a second wafer, wherein the second wafer contains a micro-electrical-mechanical system (MEMS) device and a plurality of bonding pads, wherein the MEMS device includes at least one of: actuators, mirrors, gyroscopes, or accelerometers; and
   bonding the first wafer and the second wafer together through a metal diffusion process and in a manner such that the bonding pads of the second wafer are bonded to the interconnect structure of the first wafer.

2. The method of claim 1, wherein the metal diffusion process includes:
   a process temperature that is greater than approximately 300 degrees Celsius;
   a process pressure that is greater than approximately 10 kilo-newtons; and
   a process duration that is in a range from approximately 9 minutes to approximately 15 minutes.

3. The method of claim 1, wherein the bonding is performed such that the bonding pads of the second wafer are bonded to a subset of the metal lines in a top-most metal layer of the interconnect structure of the first wafer.

4. The method of claim 1, wherein:
   the bonding pads each have a first material composition;
   the meta lines each have a second material composition; and
   the first material composition is different from the second material composition.

5. The method of claim 4, wherein one of the first and second material compositions include aluminum, and wherein the other one of the first and second material compositions include titanium.

6. The method of claim 1, further comprising: annealing the first and second wafers after the bonding.

7. The method of claim 1, further comprising: after the bonding of the first wafer and the second wafer, bonding a capping layer to the first wafer in a manner such that the MEMS device is hermetically sealed therein.

8. A method of packaging, comprising:
   providing a first wafer, wherein the first wafer contains a plurality of transistors and an interconnect structure having a plurality of metal layers;
   providing a second semiconductor wafer, wherein the second semiconductor wafer contains a through-silicon-via (TSV) and a bonding pad disposed on the TSV, wherein the TSV extends vertically through the second semiconductor wafer from a first surface of the second semiconductor wafer to a second surface of the second semiconductor wafer opposite the first surface; and
   bonding, through a metal diffusion process, the bonding pad of the second semiconductor wafer to a top-most metal layer of the interconnect structure of the first wafer.

9. The method of claim 8, wherein the bonding is carried out using a metal diffusion process that includes:
   a process temperature that is greater than approximately 300 degrees Celsius;
   a process pressure that is greater than approximately 10 kilo-newtons; and
   a process duration that is in a range from approximately 9 minutes to approximately 15 minutes.

10. The method of claim 8, wherein the second semiconductor wafer is a three-dimensional integrated circuit (3D-IC) wafer and includes a plurality of transistors.

11. The method of claim 8, wherein one of the interconnect structure and the bonding pad contains titanium, and the other one of the interconnect structure and the bonding pad contains aluminum.

12. The method of claim 8, further comprising: annealing the first wafer and the second semiconductor wafer after the bonding.

13. A method of packaging, comprising:
   providing a first semiconductor wafer and a second semiconductor wafer;
   forming a first bonding pad on the first wafer, the first bonding pad including a first bonding material;
   forming a second bonding pad on the second wafer, the second bonding pad including a second material different from the first material, one of the first and second materials being aluminum, and the other thereof being a titanium alloy;
   bonding the first and second wafers together through the first and second bonding pads;
   providing a third wafer;
   forming a third bonding pad on the first wafer, the third bonding pad including a third material;
   forming a fourth bonding pad on the third wafer, the fourth bonding pad having a fourth material different from the third material, one of the third and fourth materials being aluminum, and the other thereof being a titanium alloy; and
   after the bonding the first and second wafers, bonding the first and third wafers together through the third and fourth bonding pads.

14. The method of claim 13, wherein the bonding is carried out using a metal diffusion process that includes:
   a process temperature that is greater than approximately 100 degrees Celsius;
   a process pressure that is greater than approximately 10 kilo-newtons; and
   a process duration that is in a range from approximately 3 minutes to approximately 300 minutes.

15. The method of claim 13, further including: after the bonding, annealing the first and second wafers at a temperature in a range from approximately 200 degrees Celsius to approximately 500 degrees Celsius for a duration in a range from approximately 0.5 hours to approximately 6 hours.

16. The method of claim 13, wherein:
   the forming one of the first and second bonding pads having the titanium alloy is carried out using a process selected from the group consisting of: physical vapor deposition, chemical vapor deposition, evaporation, electron beam gun, ion beam, energy beam, and plating; and the titanium alloy has a chemical composition of $Ti_xAl_yCu_z$, x, y, and z each being in a range from 0 to 100.

17. The method of claim 13, wherein:

the first wafer has a transistor;

the second wafer has a micro-electrical-mechanical system (MEMS) device; and the third wafer is a capping layer.

18. The method of claim 13, wherein:

the providing the first wafer is carried out in a manner so that the first wafer has an interconnect structure that includes a plurality of metal interconnect features; and the forming the first bonding pad is carried out in a manner so that the first bonding pad is one of the metal interconnect features.

19. The method of claim 13, wherein:

the providing the second wafer is carried out in a manner so that the second wafer includes a through-silicon via (TSV); and the forming the second bonding pad is carried out in a manner so that the second bonding pad is electrically coupled to the TSV.

20. The method of claim 8, wherein the TSV consists of a single via.

* * * * *